US012805248B2

(12) United States Patent
Park et al.

(10) Patent No.: US 12,805,248 B2
(45) Date of Patent: Nov. 17, 2026

(54) TRANSFER CHAMBER AND WAFER PROCESSING MODULE COMPRISING TRANSFER CHAMBER

(71) Applicant: SEMES CO., LTD., Cheonan-si (KR)

(72) Inventors: Shi Hyun Park, Pyeongtaek-si (KR); Joon Hwan Jang, Cheonan-si (KR); Inhwang Park, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 832 days.

(21) Appl. No.: 18/114,749

(22) Filed: Feb. 27, 2023

(65) Prior Publication Data

US 2023/0317479 A1 Oct. 5, 2023

(30) Foreign Application Priority Data

Apr. 4, 2022 (KR) ........................ 10-2022-0041880

(51) Int. Cl.
*H10P 72/00* (2026.01)
*H10P 72/76* (2026.01)

(52) U.S. Cl.
CPC ...... *H10P 72/0464* (2026.01); *H10P 72/0402* (2026.01); *H10P 72/0458* (2026.01); *H10P 72/0466* (2026.01); *H10P 72/0604* (2026.01); *H10P 72/7602* (2026.01)

(58) Field of Classification Search
CPC ......... H01L 21/67196; H01L 21/67017; H01L 21/67178; H01L 21/67201; H01L 21/67253; H01L 21/68707; H10P 72/0464; H10P 72/0402; H10P 72/0458; H10P 72/0466; H10P 72/0604; H10P 72/7602
See application file for complete search history.

(56) References Cited

U.S. PATENT DOCUMENTS

| | | | | |
|---|---|---|---|---|
| 7,022,009 | B2 | 4/2006 | Kim | |
| 9,136,147 | B2 * | 9/2015 | Park | H01L 21/67126 |
| 9,387,709 | B2 * | 7/2016 | Mauck | H01L 21/6719 |
| 10,365,216 | B2 | 7/2019 | Zhang et al. | |
| 10,692,702 | B2 | 6/2020 | Kim et al. | |
| 11,049,740 | B1 | 6/2021 | Rice | |

(Continued)

FOREIGN PATENT DOCUMENTS

| | | |
|---|---|---|
| KR | 10-2005-0045311 | 5/2005 |
| KR | 10-2014-0110967 | 9/2014 |

(Continued)

OTHER PUBLICATIONS

Office Action from the Korean Intellectual Property Office dated Oct. 23, 2024.

*Primary Examiner* — Saul Rodriguez

(57) ABSTRACT

Provided is a transfer chamber disposed between a buffer unit providing a space where wafers stay before being transferred, and process chambers each providing a space where a wafer processing process is performed, to transfer the wafers, the transfer chamber including a main robot for transferring the wafers between the buffer unit and the process chambers, or between the process chambers, a guide rail connected to the main robot to move the main robot, and a frame defining a space where the main robot and the guide rail of the transfer chamber operate, wherein a plurality of closers are connected to the frame to close a plurality of opening regions formed by the frame.

19 Claims, 10 Drawing Sheets

(56) References Cited

U.S. PATENT DOCUMENTS

| | | | | |
|---|---|---|---|---|
| 11,189,511 | B2 * | 11/2021 | Reuter | H01L 21/67389 |
| 11,456,198 | B2 | 9/2022 | Bae et al. | |
| 2004/0026580 | A1 * | 2/2004 | Schauer | H01L 21/67196 248/188.4 |
| 2015/0224800 | A1 | 8/2015 | Mauck et al. | |
| 2021/0050235 | A1 | 2/2021 | Yun et al. | |

FOREIGN PATENT DOCUMENTS

| | | |
|---|---|---|
| KR | 10-2015-0113257 | 10/2015 |
| KR | 10-2017-0133992 | 12/2017 |
| KR | 10-2019-0083367 | 7/2019 |
| KR | 10-2021-0023448 | 3/2021 |
| KR | 10-2021-0104933 | 8/2021 |
| KR | 10-2021-0110529 | 9/2021 |

* cited by examiner

TRANSFER CHAMBER AND WAFER PROCESSING MODULE COMPRISING TRANSFER CHAMBER

CROSS-REFERENCE TO RELATED PATENT APPLICATION

This application claims the benefit of Korean Patent Application No. 10-2022-0041880, filed on Apr. 4, 2022, in the Korean Intellectual Property Office, the disclosure of which is incorporated herein in its entirety by reference.

BACKGROUND OF THE INVENTION

1. Field of the Invention

The present invention relates to a semiconductor apparatus and, more particularly, to a transfer chamber and a wafer processing module.

2. Description of the Related Art

Various processes such as photolithography, etching, ashing, ion injection, deposition, and cleaning are performed on wafers to manufacture semiconductor devices, and various wafer processing apparatuses are used for such processes. Circuit patterns are getting finer and denser due to the increase in performance of semiconductor devices, and contaminants such as fine particulates, organic substances, and metals remaining on the wafer surface may exert a significant effect on the characteristics and production yield of semiconductor devices.

As such, a space where the wafers are transferred needs to be maintained in a clean process atmosphere, and a space where the wafers are processed needs to be maintained in a constant process atmosphere. The process atmosphere is maintained by controlling supply and discharge of a liquid chemical and a process gas to and from the wafer processing space. However, in an emergency situation in which the liquid chemical and the process gas supplied to the wafer processing apparatus leak to the outside due to excessive supply, in which an exhaust line is clogged up by process byproducts, or in which a proper airflow is not formed in the exhaust line, contaminants such as the liquid chemical and the process gas may leak to the outside of the wafer processing apparatus. These contaminants may flow into a wafer transfer chamber connected to the wafer processing space and then move along a buffer chamber and an index module connected to the transfer chamber to contaminate the entirety of a wafer processing system, the outside of the wafer processing system, or the periphery of the wafer processing system. As such, a technology for preventing leakage of the contaminants from the wafer processing apparatus to the entirety of the wafer processing system, to the outside of the wafer processing system, or to the periphery of the wafer processing system is required.

SUMMARY OF THE INVENTION

The present invention provides a transfer chamber and wafer processing module capable of preventing leakage of contaminants from a wafer processing apparatus into the transfer chamber or to the outside of the transfer chamber.

The present invention also provides a transfer chamber and wafer processing module capable of preventing spread of contaminants to the entirety of a wafer processing system, to the outside of the wafer processing system, or to the periphery of the wafer processing system by closing a path to a buffer unit when an emergency situation occurs.

The present invention also provides a transfer chamber and wafer processing module capable of protecting a system and a user outside a wafer processing apparatus by preventing leakage of contaminants.

However, the scope of the present invention is not limited thereto.

According to an aspect of the present invention, there is provided a transfer chamber disposed between a buffer unit providing a space where wafers stay before being transferred, and process chambers each providing a space where a wafer processing process is performed, to transfer the wafers, the transfer chamber including a main robot for transferring the wafers between the buffer unit and the process chambers, or between the process chambers, a guide rail connected to the main robot to move the main robot, and a frame defining a space where the main robot and the guide rail of the transfer chamber operate, wherein a plurality of closers are connected to the frame to close a plurality of opening regions formed by the frame.

The frame may include a plurality of first frames extending in a first direction, a plurality of second frames extending in a second direction perpendicular to the first direction, and a plurality of third frames extending in a third direction perpendicular to a horizontal plane formed by the first and second directions, and the opening regions may be formed by a combination of the plurality of first frames, the plurality of second frames, and the plurality of third frames.

The closers may close the opening regions except for a first connection opening serving as a passage for connecting the buffer unit to the transfer chamber, and second connection openings serving as passages for connecting the process chambers to the transfer chamber.

The transfer chamber may further include a buffer door mounted to be vertically movable on a side surface connected to the buffer unit to open or close the first connection opening.

The transfer chamber may further include a gas sensor for sensing a gas leaking from an inside of the transfer chamber through the first connection opening.

The second connection openings may be provided to face the shutters for opening or closing wafer paths of the process chambers.

Each of the closers may include a supporter mounted along an edge of the opening region formed by the frame, and a cover connected to the supporter.

An O-ring may be interposed between the supporter and the cover.

The closers may be bonded to the frame by interposing a molding adhesive therebetween.

A powder coat may be further formed on bonded portions between the frame and the closers.

Airflow suppliers may be mounted on the transfer chamber to form downward airflows in an inner space of the transfer chamber.

Exhaust pipes for expelling the downward airflows to an outside may be provided under the transfer chamber.

Exhaust holes connected to the exhaust pipes may be provided in a closer disposed on a bottom surface of the transfer chamber.

According to another aspect of the present invention, there is provided a wafer processing module including a buffer unit providing a space where wafers stay before being transferred from an outside into a transfer chamber or from the transfer chamber to the outside, the transfer chamber disposed between the buffer unit and process chambers to transfer the wafers between the buffer unit and the process chambers, or between the process chambers, and the process chambers for performing processes on the wafers, wherein the transfer chamber includes a main robot for transferring the wafers between the buffer unit and the process chambers, or between the process chambers, a guide rail connected to the main robot to move the main robot, and a frame defining a space where the main robot and the guide rail of the transfer chamber operate, and wherein a plurality of closers are connected to the frame to close a plurality of opening regions formed by the frame.

The frame may include a plurality of first frames extending in a first direction, a plurality of second frames extending in a second direction perpendicular to the first direction, and a plurality of third frames extending in a third direction perpendicular to a horizontal plane formed by the first and second directions, and the opening regions may be formed by a combination of the plurality of first frames, the plurality of second frames, and the plurality of third frames.

The closers may close the opening regions except for a first connection opening serving as a passage for connecting the buffer unit to the transfer chamber, and second connection openings serving as passages for connecting the process chambers to the transfer chamber.

The wafer processing module may further include a buffer door mounted to be vertically movable on a side surface connected to the buffer unit to open or close the first connection opening.

The second connection openings may be provided to face the shutters for opening or closing wafer paths of the process chambers.

Airflow suppliers may be mounted on the transfer chamber to form downward airflows in an inner space of the transfer chamber, and exhaust pipes for expelling the downward airflows to an outside may be provided under the transfer chamber.

According to another aspect of the present invention, there is provided a wafer processing module including a buffer unit providing a space where wafers stay before being transferred from an outside into a transfer chamber or from the transfer chamber to the outside, the transfer chamber disposed between the buffer unit and process chambers to transfer the wafers between the buffer unit and the process chambers, or between the process chambers, and the process chambers for performing processes on the wafers, wherein the transfer chamber includes a main robot for transferring the wafers between the buffer unit and the process chambers, or between the process chambers, a guide rail connected to the main robot to move the main robot, and a frame defining a space where the main robot and the guide rail of the transfer chamber operate, wherein a plurality of closers are connected to the frame to close a plurality of opening regions formed by the frame, except for a first connection opening serving as a passage for connecting the buffer unit to the transfer chamber, and second connection openings serving as passages for connecting the process chambers to the transfer chamber, wherein the wafer processing module further includes a buffer door mounted to be vertically movable on a side surface connected to the buffer unit to open or close the first connection opening, wherein the second connection openings are provided to face the shutters for opening or closing wafer paths of the process chambers, and wherein, in an emergency situation, the buffer door closes the first connection opening, the shutters close the second connection openings, and the closers close the plurality of opening regions, thereby preventing leakage of a gas to the outside of the transfer chamber.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
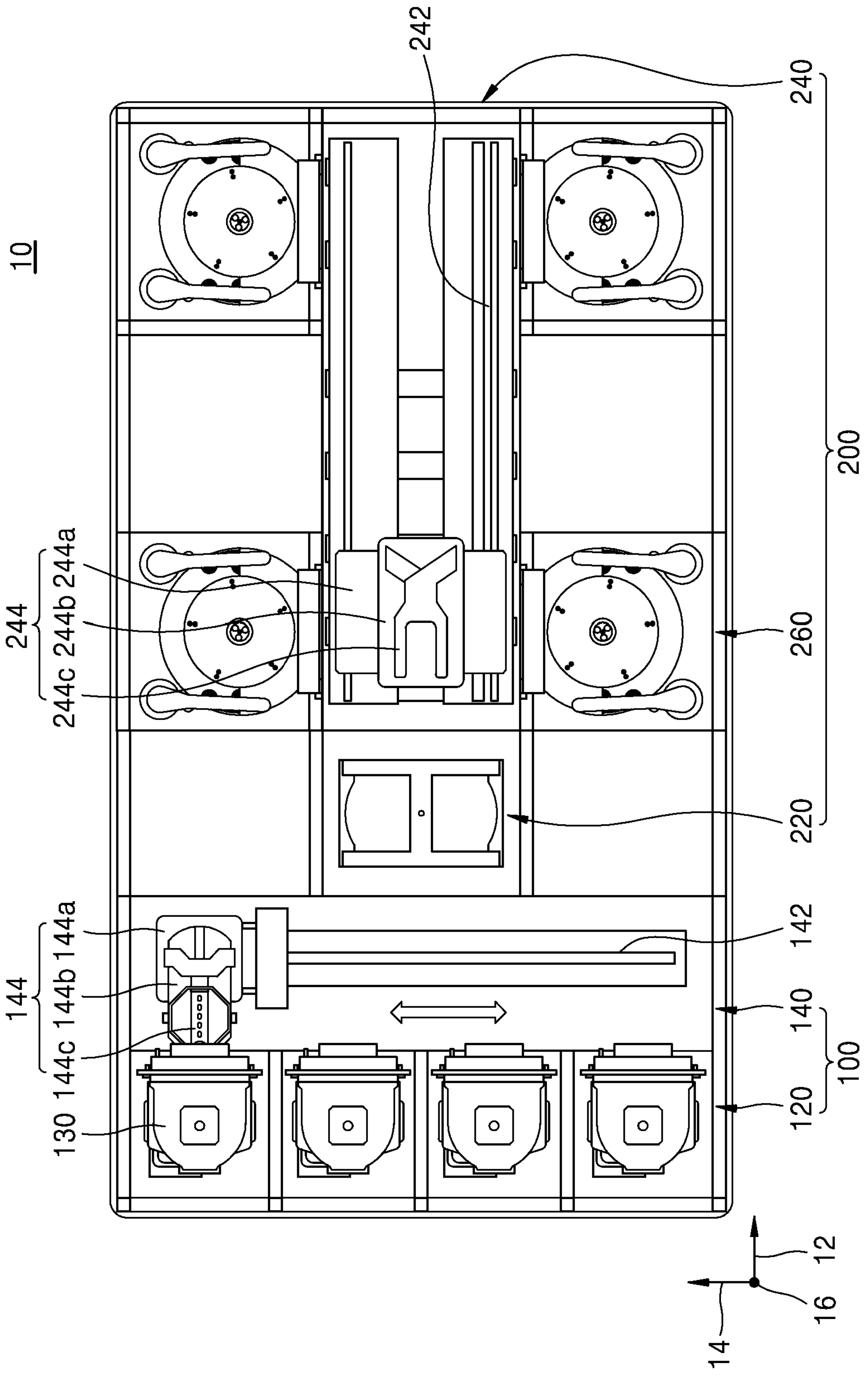
FIG. 1 is a plan view of a wafer processing system according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity or convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

FIG. 1 is a plan view of a wafer processing system 10 according to an embodiment of the present invention.

Referring to FIG. 1, the wafer processing system 10 includes an index module 100 and a wafer processing module 200. The index module 100 includes a load port 120 and a transfer frame 140. The load port 120, the transfer frame 140, and the wafer processing module 200 may be sequentially arranged. Herein, a direction in which the load port 120, the transfer frame 140, and the wafer processing module 200 are arranged is referred to as a first direction 12 (or an x-axis direction), a direction perpendicular to the first direction 12 when viewed from above is referred to as a second direction 14 (or an y-axis direction), and a direction perpendicular to a plane including the first and second directions 12 and 14 (i.e., an xy plane) is referred to as a third direction 16 (or a z-axis direction).

A carrier 130 containing wafers W is seated on the load port 120. A plurality of load ports 120 may be disposed along the second direction 14. The number of load ports 120 may increase or decrease depending on process efficiency of the wafer processing module 200, production efficiency, or the like. The carrier 130 may use a front opening unified pod (FOUP) and include slots for holding a plurality of wafers W horizontally.

The wafer processing module 200 includes a buffer unit 220, a transfer chamber 240, and process chambers 260. The transfer chamber 240 may extend in parallel with the first direction 12, and the process chambers 260 may be disposed at both sides in a lengthwise direction of the transfer chamber 240. Some of the process chambers 260 may be stacked on one another. Meanwhile, the process chambers 260 may be disposed only at one side of the transfer chamber 240.

The buffer unit 220 is disposed between the transfer frame 140 and the transfer chamber 240, and provides a space where the wafers W stay before being transferred between the transfer frame 140 and the transfer chamber 240. The buffer unit 220 includes slots where the wafers W are disposed. The buffer unit 220 may be provided to be open to the transfer frame 140 and the transfer chamber 240.

The transfer frame 140 may transfer the wafers W between the carrier 130 and the buffer unit 220. The transfer frame 140 is provided with an index rail 142 and an index robot 144. The index rail 142 may extend in parallel with the second direction 14, and the index robot 144 may be mounted thereon to move along the second direction 14. The index robot 144 includes a base 144*a*, a body 144*b*, and an index arm 144*c*. The base 144*a* is mounted to be movable along the index rail 142. The body 144*b* is coupled to the base 144*a* and mounted to be rotatable and movable along the third direction 16 on the base 144*a*. The index arm 144*c* is coupled to the body 144*b* and provided to be movable away from or toward the body 144*b*. A plurality of index arms 144*c* may be provided and individually driven. Each index arm 144*c* may be used to transfer the wafer W from the carrier 130 to the wafer processing module 200, or from the wafer processing module 200 to the carrier 130.

The transfer chamber 240 transfers the wafers W between the buffer unit 220 and the process chambers 260, or between the process chambers 260. The transfer chamber 240 is provided with a guide rail 242 and a main robot 244. The guide rail 242 may extend in parallel with the first direction 12, and the main robot 244 may be mounted thereon to move along the first direction 12. The main robot 244 includes a base 244*a*, a body 244*b*, and a main arm 244*c*. The base 244*a* is mounted to be movable along the guide rail 242. The body 244*b* is coupled to the base 244*a* and mounted to be rotatable and movable along the third direction 16 on the base 244*a*. The main arm 244*c* is coupled to the body 244*b* and provided to be movable away from or toward the body 244*b*. A plurality of main arms 244*c* may be provided and individually driven.

Each process chamber 260 is provided with a wafer processing apparatus 400 (see FIG. 4) for performing a process on the wafer W. The wafer processing apparatus 400 may have a different structure depending on the performed process. Meanwhile, the wafer processing apparatuses 400 in all process chambers 260 may have the same structure, or the wafer processing apparatuses 400 in process chambers 260 belonging to the same group may have the same structure.

The wafer processing apparatus 400 may perform a cleaning process to perform liquid treatment on the wafer W. The wafer processing apparatus 400 may perform a heating process to heat the wafer W. The wafer processing apparatus 400 is not limited thereto and also applicable to an etching apparatus, a photolithography apparatus, etc.

Figure 2:
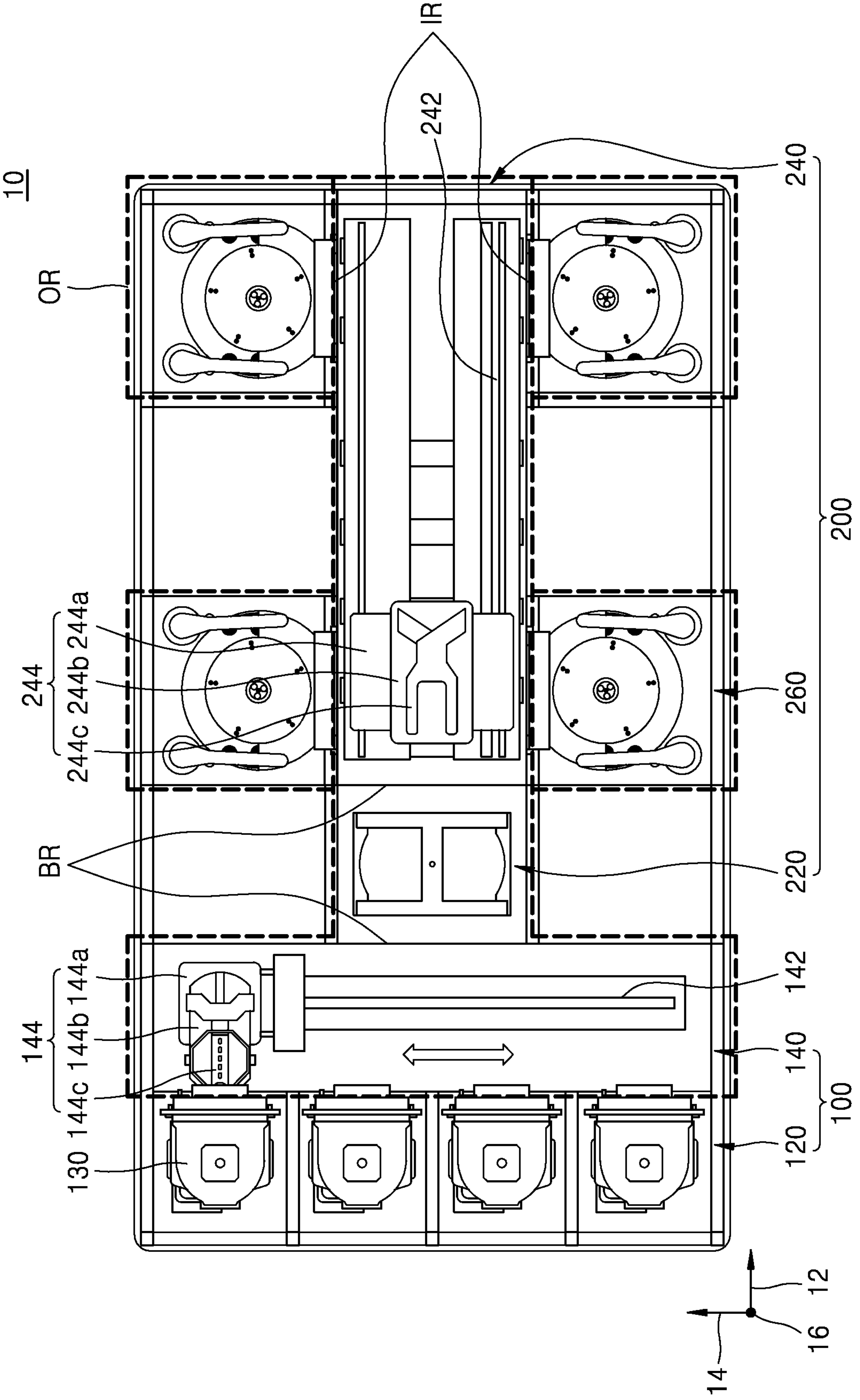
FIG. 2 is a plan view showing open regions of a general wafer processing system.
Figure 3:
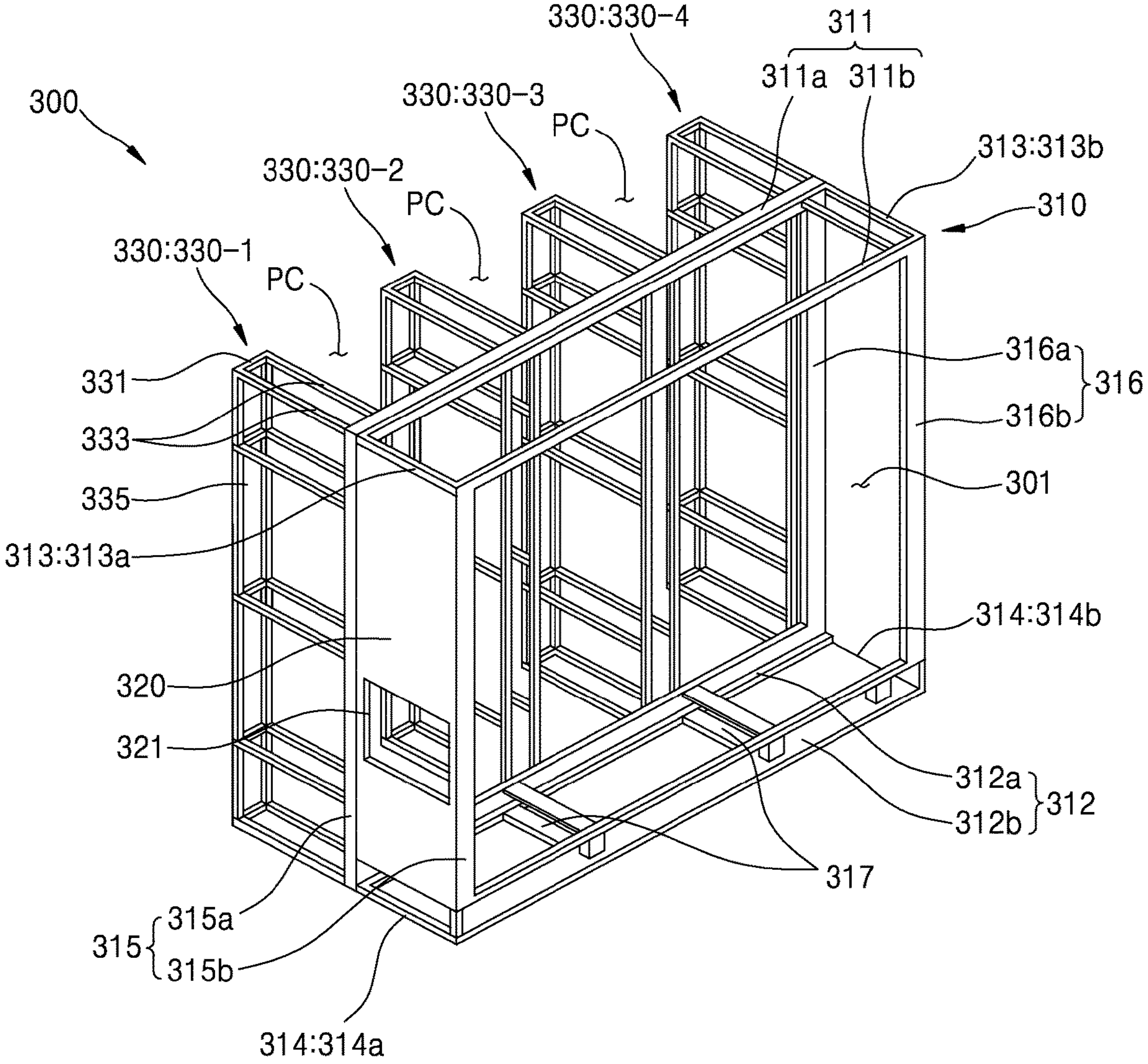
FIG. 3 is a perspective view of a frame in which a general transfer chamber is connected to wafer processing apparatuses.
Figure 4:
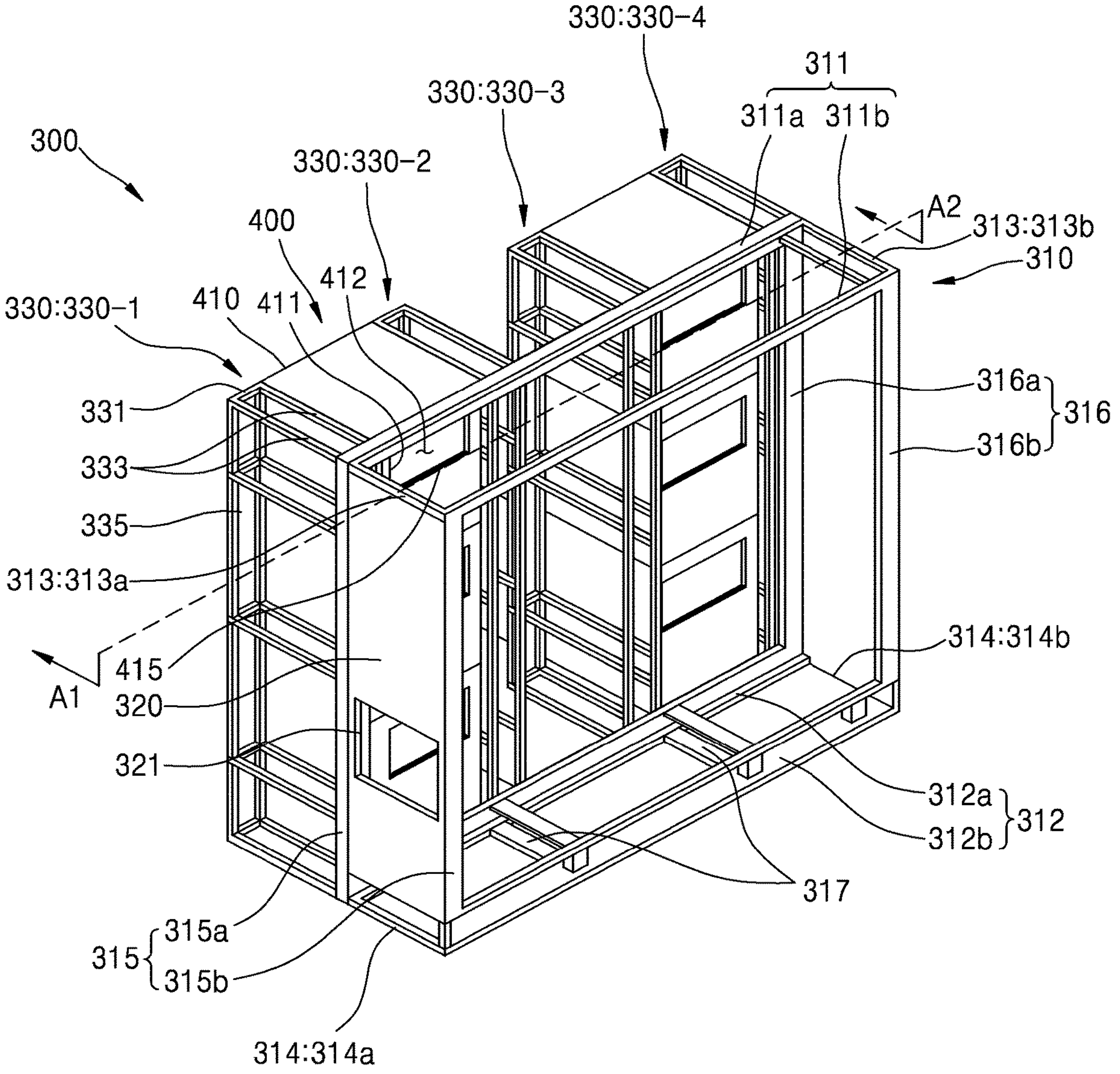
FIG. 4 is a perspective view showing a state in which a general transfer chamber is connected to wafer processing apparatuses.
Figure 5:
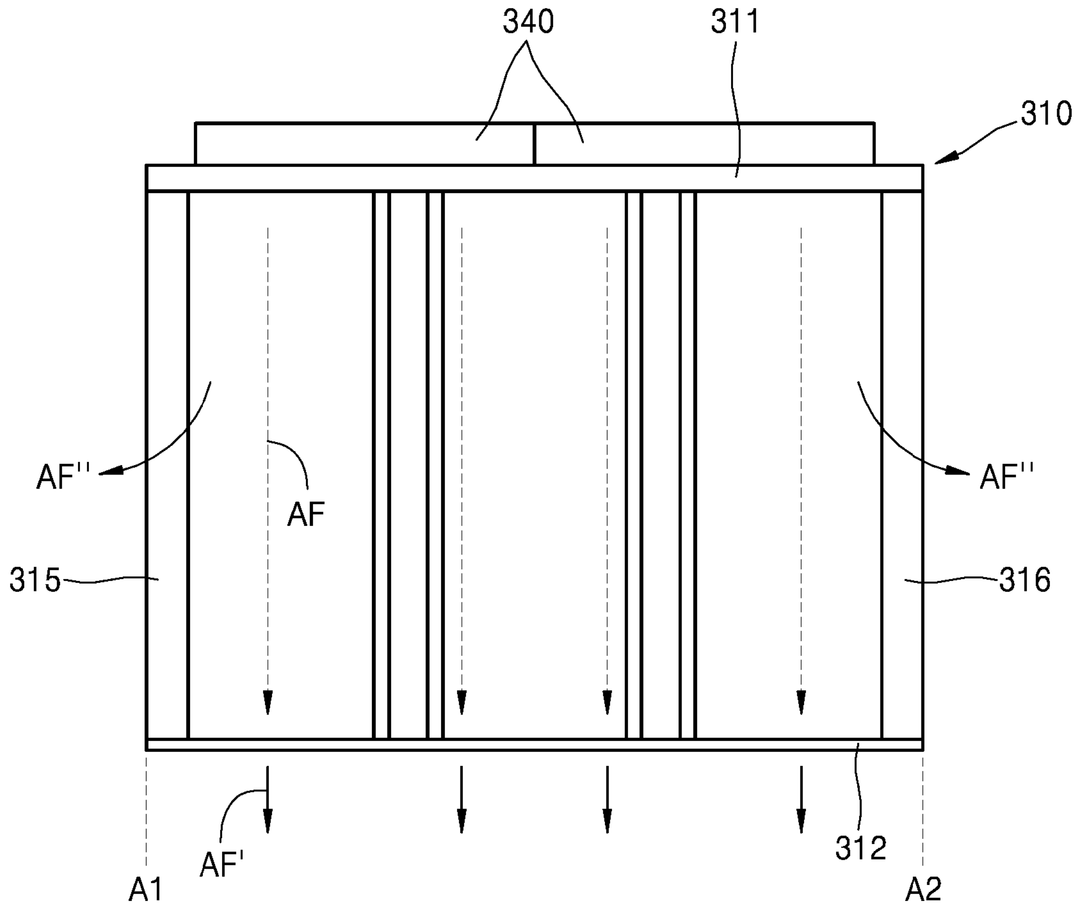
FIG. 5 is a cross-sectional view showing movements of airflows in a general transfer chamber.

FIG. 2 is a plan view showing open regions of a general wafer processing system 10. FIG. 3 is a perspective view of a frame 310 in which a general transfer chamber 300 is connected to the wafer processing apparatuses 400. FIG. 4 is a perspective view showing a state in which the general transfer chamber 300 is connected to the wafer processing apparatuses 400. FIG. 5 is a cross-sectional view showing movements of airflows in the general transfer chamber 300. In relation to FIGS. 2 to 10, the transfer chamber 240 of FIG. 1 may be used interchangeably with the transfer chamber 300, and the process chambers 260 may be used interchangeably with the wafer processing apparatuses 400.

Referring to FIG. 2, the transfer frame 140, the buffer unit 220, the transfer chamber 240, and the process chambers 260 in the wafer processing system 10 are connected to be open to each other along wafer paths. That is, the transfer frame 140, the buffer unit 220, the transfer chamber 240, and the process chambers 260 are connected not to be completely closed to each other. Regions indicated by dashed lines in FIG. 2 are regions not completely closed to each other.

Because the buffer unit 220 is open, a region BR where the buffer unit 220 is in contact with the transfer frame 140 and a region BR where the buffer unit 220 is in contact with the transfer chamber 240 are open. Regions IR where the transfer chamber 240 is in contact with the process chambers 260 are also open. Herein, when the regions IR are open, it means that the regions IR where outer surfaces of the process chambers 260 (i.e., outer surfaces of housings 410 of FIG. 4) are in contact with the transfer chamber 240 are open and not closed, and it doesn't mean that the regions IR in contact with the transfer chamber 240 are open while inner spaces of the process chambers 260 are open. The inner space of each process chamber 260 may be open or closed by using a shutter 415 (see FIG. 4). Outer regions OR of the process chambers 260 are also open. Because any component covering the outer surfaces of the process chambers 260 (i.e., the outer surfaces of the housings 410 of FIG. 4) does not exist, the outer regions OR of the process chambers 260 are open.

Referring to FIG. 3, the general transfer chamber 300 includes the frame 310 defining a space 301 of the transfer chamber 300 and constituting an outer frame. As described above in relation to FIG. 1, the guide rail 242 and the main robot 244 are provided in the inner space 301 of the frame 310. In FIGS. 3 to 10, the guide rail 242 and the main robot 244 are not shown for convenience of explanation.

The frame 310 may include a plurality of first frames 311 and 312 (i.e., a plurality of first frame bodies), a plurality of second frames 313 and 314 (i.e., a plurality of second frame bodies), and a plurality of third frames 315 and 316 (i.e., a plurality of third frame bodies). The first frames 311 and 312 may extend in the first direction 12, the second frames 313 and 314 may extend in the second direction 14, and the third frames 315 and 316 may extend in the third direction 16. The frame 310 may be configured by connecting the first, second, and third frames 311 to 316 to each other. The frame 310 may be provided in a substantially cuboid shape to define the space 301 of the transfer chamber 300. In some embodiments, the frame 310 may be of a box shape with each surface provided with an opening. Auxiliary frames 317 for reinforcing and dividing the space of the frame 310 may be further connected.

For example, a top edge of the frame 310 may be configured by disposing a pair of first frames 311: 311*a* and 311*b*, and connecting a pair of second frames 313: 313*a* and 313*b* to both ends of the first frames 311: 311*a* and 311*b*. A bottom edge of the frame 310 may be configured by disposing a pair of first frames 312: 312*a* and 312*b*, and connecting a pair of second frames 314: 314*a* and 314*b* to both ends of the first frames 312: 312*a* and 312*b*. A left edge of the frame 310 may be configured by connecting a pair of third frames 315: 315*a* and 315*b* to a pair of the second frames 313*a* and 314*a*, and a right edge of the frame 310 may be configured by connecting a pair of third frames 316: 316*a* and 316*b* to a pair of the second frames 313*b* and 314*b*.

A left side 320 of the frame 310 may be a closed surface structure. However, a first connection opening 321 may be provided on the left side 320 as a passage for connecting the buffer unit 220 to the transfer chamber 300.

Support frames 330 may be connected to a rear side of the frame 310. Although a state in which the support frames 330 are connected to a front side of the frame 310 is not shown in FIG. 3 for convenience of explanation, it may be understood that the support frames 330 may be connected to the front side and/or the rear side. The wafer processing apparatuses 400 (or the process chambers 260) may be mounted and supported on the support frames 330. Each support frame 330 may include a combination of first support frames 331 extending in the first direction 12, second support frames 333 extending in the second direction 14, and third support frames 335 extending in the third direction 16.

A space PC in which the wafer processing apparatuses 400 (or the process chambers 260) may be mounted is provided between each pair of neighboring support frames 330-1 and 330-2, 330-2 and 330-3, or 330-3 and 330-4. FIG. 4 shows that the wafer processing apparatuses 400 are mounted in the spaces PC between the support frames 330-1 and 330-2, and 330-3 and 330-4. Although three wafer processing apparatuses 400 are mounted on the support frames 330 in a vertically stacked form in FIG. 4, the number, positions, stacking intervals, etc. of the wafer processing apparatuses 400 may change.

Each wafer processing apparatus 400 includes a housing 410 providing a space 412 where a wafer is processed. An opening 411 may be provided at a side of the housing 410 and used as a passage through which the wafer enters or exits. A shutter 415 or a door may be mounted on the opening 411 to open or close the opening 411. In a wafer processing process, the opening 411 is closed to seal the inner space 412 of the housing 410. For example, when the wafer processing apparatus 400 is a cleaning apparatus, a processing vessel such as a bowl, a processing vessel lift, a wafer support plate, and a liquid discharger may be disposed in the inner space 412. As another example, when the wafer processing apparatus 400 is a heating apparatus, a wafer support plate and a heater may be disposed in the inner space 412.

The frame 310 and the support frames 330 form a plurality of opening regions (i.e., a plurality of openings). That is, because the frame 310 consists of ribs, surfaces thereof may be open to form a plurality of opening regions. The opening regions of the frame 310 and the support frames 330 may correspond to the open regions described above in relation to FIG. 2. The opening regions may be understood as regions through which a gas may pass. Specifically, assuming that the first direction 12 (or the x-axis direction) is a left-right direction, at top, bottom, and right sides of the frame 310, only the frame 310 exists and thus a plurality of opening regions are formed. At portions of front and rear sides of the frame 310, only the frame 310 exists and thus a plurality of opening regions are formed and, at other portions thereof, the wafer processing apparatuses 400 are disposed but portions where the wafer processing apparatuses 400 are connected to the frame 310 are not completely sealed and thus it may be understood that a plurality of opening regions are formed. Although the left side 320 of the frame 310 is a closed surface structure, the first connection opening 321 provided as a passage for connecting the buffer unit 220 to the transfer chamber 300 may serve as an opening region.

When an emergency situation occurs, contaminants, toxic substances, process byproducts, etc. may leak from the wafer processing apparatuses 400 into the inner space 301 of the transfer chamber 300 through the opening regions. The emergency situation may correspond to a situation in which contaminants remain in a space where the wafer processing apparatuses 400 are connected to the transfer chamber 300 (or the frame 310). That is, the emergency situation may correspond to a situation in which contaminants in the wafer processing apparatuses 400 are not completely expelled but remain.

In general, contaminants and process byproducts are expelled through exhaust lines (not shown) of the wafer processing apparatuses 400 before the shutters 415 of the wafer processing apparatuses 400 are open, and thus do not remain in the space where the wafer processing apparatuses 400 are connected to the transfer chamber 300 (or the frame 310). However, in an emergency situation in which the shutters 415 are open while a liquid chemical and a process gas supplied to the wafer processing apparatuses 400 are not completely expelled through the exhaust lines (not shown) due to excessive supply, in which the exhaust lines are clogged up by process byproducts or proper airflows are not formed in the exhaust lines, in which leakage occurs through the openings 411 or edges of the housings 410, or in which the wafer processing apparatuses 400 are damaged and cracked, contaminants may remain in the space where the wafer processing apparatuses 400 are connected to the transfer chamber 300 (or the frame 310). These contaminants may flow into the transfer chamber 300 and then move along the buffer unit 220 and the index module 100 connected to the transfer chamber 300 (or the transfer chamber 240) to contaminate the entirety of the wafer processing system 10. Furthermore, the contaminants may spread to the outside or periphery of the wafer processing system 10.

Referring to FIG. 5, airflow suppliers 340 may be mounted on the transfer chamber 300. The airflow suppliers 340 form downward airflows AF. However, because a plurality of opening regions are formed in the frame 310, the airflows AF pass through the opening regions and escape through the bottom (AF') and sides (AF") of the frame 310. The escaping airflows AF' and AF" are discharged into elements of the wafer processing system 10 outside the transfer chamber 300. When contaminants leak from the wafer processing apparatuses 400 into the inner space 301 of the transfer chamber 300, these contaminants may move along the directions of the airflows AF' and AF" to contaminate the elements of the wafer processing system 10, e.g., the buffer unit 220 and the index module 100.

Therefore, the transfer chamber 300 and the wafer processing module 200 of the present invention are characterized in that closers 350 are connected to the frame 310 to close the plurality of opening regions. Because the opening regions are closed, leakage of the contaminants from the wafer processing apparatuses 400 into the transfer chamber 300 may be prevented. In addition, even when the contaminants leak into the transfer chamber 300, closed paths may be formed to prevent leakage of the contaminants into the elements of the wafer processing system 10, e.g., the buffer unit 220 and the index module 100, other than the transfer chamber 300. The contaminants leaking into the transfer chamber 300 may be expelled from the transfer chamber 300 to the outside of the wafer processing system 10.

Figure 6:
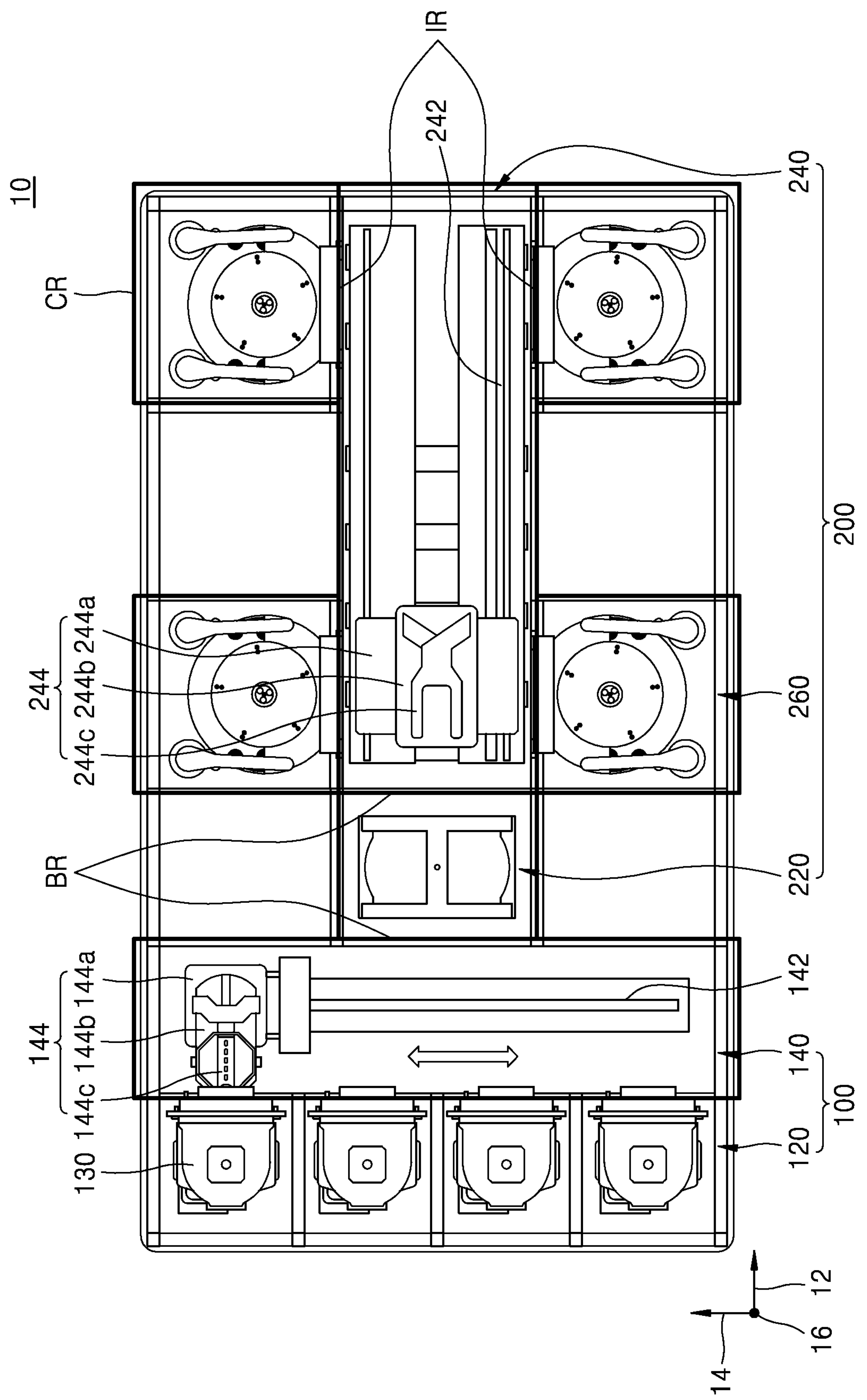
FIG. 6 is a plan view showing closed regions of a wafer processing system according to an embodiment of the present invention.
Figure 7:
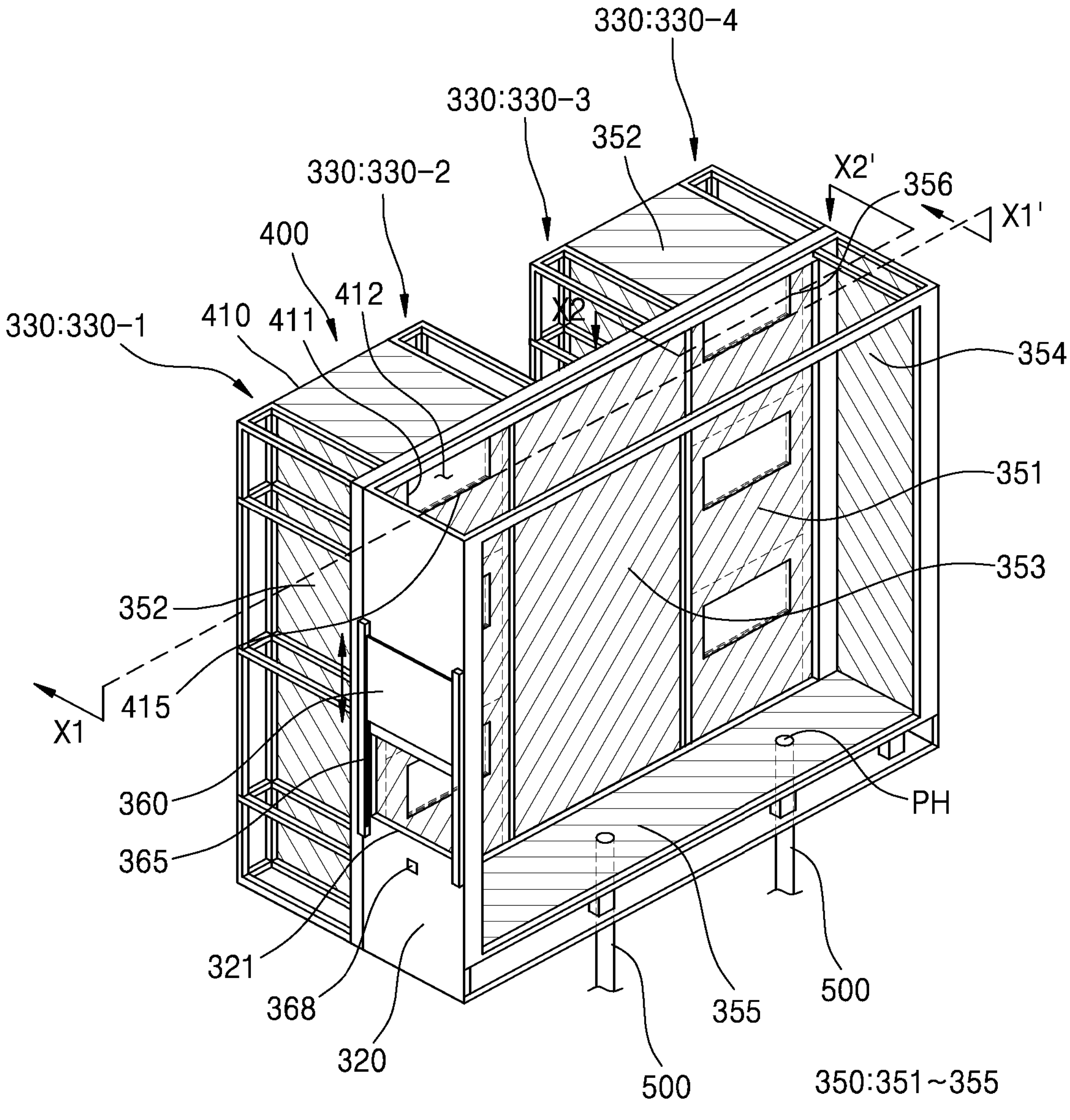
FIG. 7 is a perspective view showing a state in which a transfer chamber having closers is connected to wafer processing apparatuses, according to an embodiment of the present invention.
Figure 8:
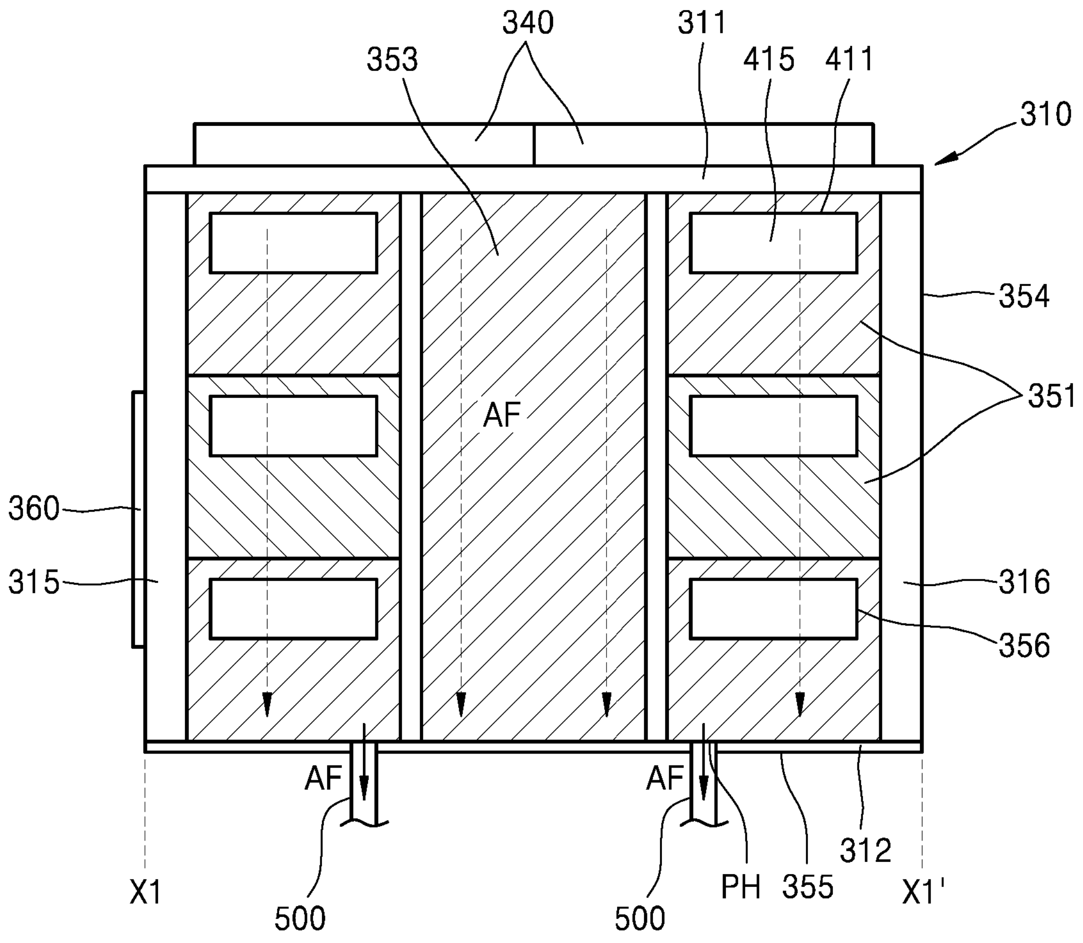
FIG. 8 is a cross-sectional view showing movements of airflows in a transfer chamber according to an embodiment of the present invention.

FIG. 6 is a plan view showing closed regions of the wafer processing system 10 according to an embodiment of the present invention. FIG. 7 is a perspective view showing a state in which the transfer chamber 300 having the closers 350 is connected to the wafer processing apparatuses 400, according to an embodiment of the present invention. FIG. 8 is a cross-sectional view showing movements of the airflows AF in the transfer chamber 300 according to an embodiment of the present invention. The same configurations as those described above in relation to FIGS. 2 to 5 will not be described and only differences will be described below.

Referring to FIG. 6, the transfer frame 140, the buffer unit 220, the transfer chamber 240, and the process chambers 260 in the wafer processing system 10 are connected to be open to each other along wafer paths, but may be completely sealed from each other in an emergency situation. In FIG. 6, regions indicated by thick solid lines are regions sealed from each other.

An opening region BR where the buffer unit 220 is in contact with the transfer frame 140 and an opening region BR where the buffer unit 220 is in contact with the transfer chamber 240 are open, but may be sealed by a buffer door 360 (see FIG. 7). In opening regions IR where the transfer chamber 240 is in contact with the process chambers 260, portions other than the portions which may be open or closed by the shutters 415 (see FIG. 7) of the process chambers 260 (or the wafer processing apparatuses 400) may be sealed by the closer 350: 351. Inner spaces of the process chambers 260 (or the wafer processing apparatuses 400) may be sealed by the shutters 415. Outer opening regions CR of the process chambers 260 (or the wafer processing apparatuses 400) may be sealed by the closer 350: 352.

Referring to FIG. 7, a plurality of closers 350: 351, 352, 353, 354, and 355 are connected to the frame 310 (and the support frames 330). The closers 350 has a plate shape and is provided to close opening regions of the frame 310 (and the support frames 330). The closers 350 may have a rectangular or polygonal shape depending on the shape of the opening regions.

The first closer 351 closes opening regions IR where the transfer chamber 300 (or the transfer chamber 240) is in contact with the wafer processing apparatuses 400 (or the process chambers 260). The first closer 351 may close the opening regions IR except for second connection openings 356 serving as passages for connecting the transfer chamber 300 to the wafer processing apparatuses 400. The second connection openings 356 may be provided to face the shutters 415. That is, the second connection openings 356 may be connected to the shutters 415 (or the openings 411), and edges of the openings 356 may be closely sealed to the edges of the shutters 415 (or the openings 411).

The second closer 352 closes regions other than the opening regions IR where the transfer chamber 300 (or the transfer chamber 240) is in contact with the wafer processing apparatuses 400 (or the process chambers 260). The second closer 352 may be connected to the support frames 330. On the basis of FIG. 7, the first closer 351 may close front surfaces of the wafer processing apparatuses 400, and the second closer 352 may close top, bottom, left, right, and rear surfaces of the wafer processing apparatuses 400. That is, the outer regions CR of the process chambers 260 (or the wafer processing apparatuses 400) are closed by the closer 352.

Because the first closer 351 closes the opening regions IR and the second closer 352 closes the opening regions CR, spaces between outer sides of the housings 410 of the wafer processing apparatuses 400 and the frame 310 (and the support frames 330) in contact with the wafer processing apparatuses 400 may be sealed. As such, even when contaminants leak from portions except for the openings 411 of the wafer processing apparatuses 400, the contaminants may exist only in the spaces sealed by the frame 310 (and the support frames 330) and the first and second closers 351 and 352, and be prevented from entering the inner space 301 of the transfer chamber 300.

The third and fourth closers 353 and 354 close opening regions on rear and right surfaces of the frame 310.

The fifth closer 355 closes an opening region on a bottom surface of the frame 310. The fifth closer 355 may have exhaust holes PH. The exhaust holes PH are connected to exhaust pipes 500 or exhaust apparatuses extending to the outside of the transfer chamber 300.

Meanwhile, as shown in FIG. 8, the airflow suppliers 340 may be disposed on the top surface of the frame 310 to close opening regions. Alternatively, the closers 350 may be disposed instead of the airflow suppliers 340 or the airflow suppliers 340 and the closers 350 may be disposed together to close the opening regions.

The buffer door 360 is mounted on the left side 320 of the transfer chamber 300 connected to the buffer unit 220. The buffer door 360 is mounted to be vertically movable along a door driver 365. The buffer door 360 may open or close the first connection opening 321 corresponding to the opening region BR and serving as a passage for connecting the buffer unit 220 to the transfer chamber 300. The buffer door 360 moves upward to open the first connection opening 321. The buffer door 360 moves downward to close the first connection opening 321. Additionally, for tighter sealing, the buffer door 360 may move downward to correspond to the first connection opening 321 and then further move back or forth in the first direction 12.

Meanwhile, a gas sensor 368 for sensing a gas leaking from the inside of the transfer chamber 300 through the first connection opening 321 may be further provided. The gas sensor 368 may be mounted on the left side 320, the buffer door 360, or the like. In an emergency situation, when a gas leaking from the wafer processing apparatuses 400 into the transfer chamber 300 moves to the first connection opening 321, the gas sensor 368 may sense the gas and a controller (not shown) may control the buffer door 360 to close the first connection opening 321. Thereafter, the controller (not shown) may immediately expel the contaminated gas in the transfer chamber 300 through the exhaust pipes 500.

Referring to FIG. 8, the airflow suppliers 340 may be mounted on the transfer chamber 300. The airflow suppliers 340 form downward airflows AF. The opening regions of the frame 310 are closed by the closers 350: 351 to 355, the first connection opening 321 is closed by the buffer door 360, and the second connection openings 356 are closed by the shutters 415 of the wafer processing apparatuses 400. Therefore, the airflows AF moving downward may not leak into the buffer unit 220 and the index module 100 of the wafer processing system 10 outside the transfer chamber 300. The airflows AF may be expelled to the outside of the wafer processing system 10 through the exhaust pipes 500 connected to the fifth closer 355. As described above, when an emergency situation occurs, leakage of contaminants from the wafer processing apparatuses 400 into the transfer chamber 300 may be prevented, and spread of the contaminants to the entirety of the wafer processing system 10 may also be prevented by closing a path to the buffer unit 220.

Figure 9:
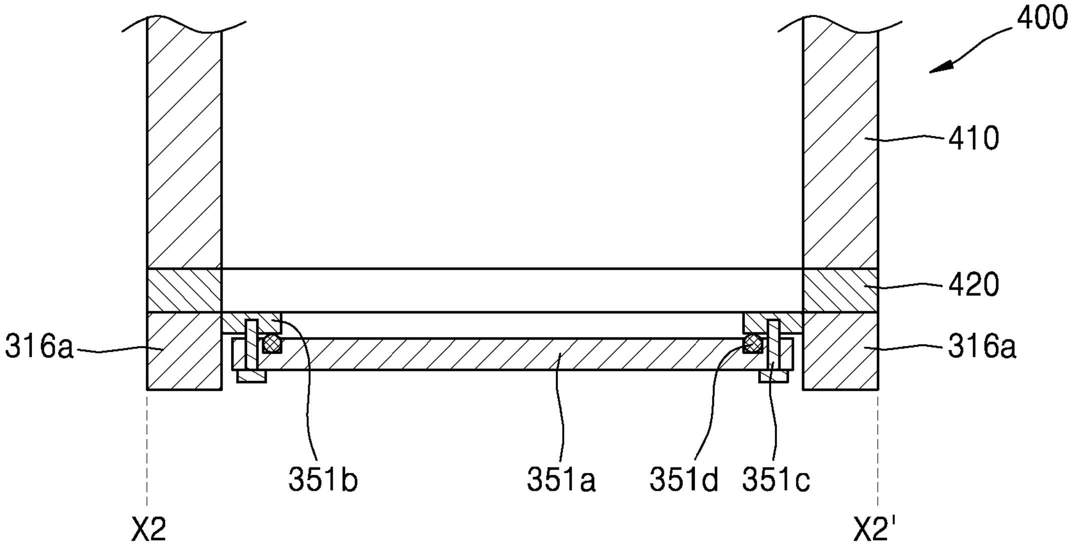
FIGS. 9 and 10 are cross-sectional views showing mounted forms of a closer, according to embodiments of the present invention.
Figure 10:
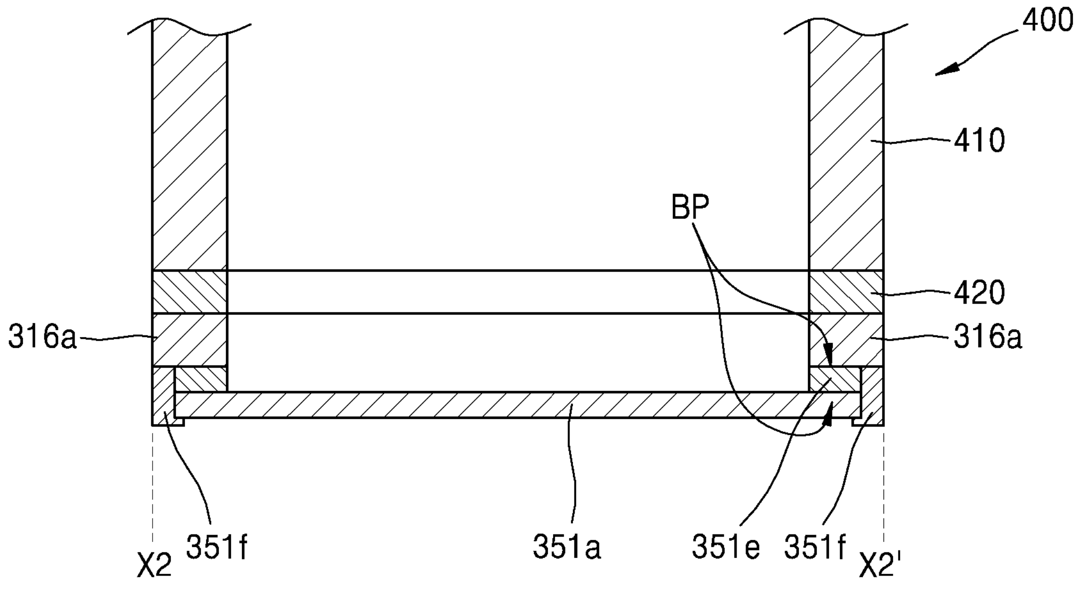

FIGS. 9 and 10 are cross-sectional views showing mounted forms of the closer 350, according to embodiments of the present invention. FIGS. 9 and 10 show first-and-second-direction (i.e., xy-plane-direction) cross-sections of the wafer processing apparatus 400, and the frame 316*a* in contact with the wafer processing apparatus 400. Although FIGS. 9 and 10 show an embodiment in which the first closer 351 is connected to the frame 316*a*, the other closers 352 to 355 may be connected to the frame 310 (or the support frames 330) in the same manner.

Referring to FIG. 9, the closer 351 according to an embodiment may include a cover 351*a* and a supporter 351*b*. The supporter 351*b* may be mounted along the edge of an opening region formed by the frame 316*a*. A chamber frame 420 may be included in the housing 410 of the wafer processing apparatus 400. The chamber frame 420 is in contact with the frame 316*a*, and a space between the housing 410 and the cover 351*a* of the closer 351 serves as a space where a contaminated gas may remain, and thus needs to be reduced as much as possible. As such, the supporter 351*b* may be mounted as close as possible to a surface where the frame 316*a* is in contact with the chamber frame 420. Then, the edge of the cover 351*a* may be connected to the supporter 351*b*. Herein, the connection may be understood as adhesion, attachment, fastening, coupling, or the like.

To closely connect the cover 351*a* to the supporter 351*b*, fastening members 351*c* such as screws may be used. To more closely connect the cover 351*a* to the supporter 351*b*, an O-ring 351*d* may be interposed therebetween.

Referring to FIG. 10, the closer 351 according to another embodiment may be provided to bond the cover 351*a* to the frame 316*a* by interposing a molding adhesive 351*e* therebetween. The molding adhesive 351*e* may use an epoxy adhesive or the like, and airtightness may be ensured by performing heat treatment after molding. After the cover 351*a* is bonded to the frame 316*a*, a powder coat 351*f* may be formed by powder-coating the bonded portion. The powder coat 351*f* may be a thin coat having chemical resistance and capable of sealing a gap in the bonded portion. As such, the closer 351 may be double-sealed by the molding adhesive 351*e* and the powder coat 351*f*.

As described above, according to an embodiment of the present invention, leakage of contaminants from a wafer processing apparatus into a transfer chamber or to the outside of the transfer chamber may be prevented.

Furthermore, according to an embodiment of the present invention, spread of contaminants to the entirety of a wafer processing system, to the outside of the wafer processing system, or to the periphery of the wafer processing system may be prevented by closing a path to a buffer unit when an emergency situation occurs.

In addition, according to an embodiment of the present invention, a system and a user outside a wafer processing apparatus may be protected by preventing leakage of contaminants.

However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A transfer chamber, disposed between a buffer unit providing a space where wafers stay before being transferred and process chambers each providing a space where a wafer processing process is performed, for transferring the wafers, the transfer chamber comprising:

a main robot for transferring the wafers between the buffer unit and the process chambers, or between the process chambers;

a guide rail connected to the main robot to move the main robot;

a frame defining an inner space where the main robot and the guide rail of the transfer chamber operate and provided with a plurality of openings connected to the inner space; and a plurality of closers connected to the frame and covering the plurality of openings such that the plurality of closers close the plurality of openings of the frame, and airflow suppliers mounted on the transfer chamber to form downward airflows in the inner space of the transfer chamber and expel the downward airflows through exhaust pipes to an outside.

2. The transfer chamber of claim 1, wherein the frame comprises:

a plurality of first frame bodies extending in a first direction;

a plurality of second frame bodies extending in a second direction perpendicular to the first direction; and a plurality of third frame bodies extending in a third direction perpendicular to a horizontal plane formed by the first and second directions, and wherein the plurality of first frame bodies, the plurality of second frame bodies, and the plurality of third frame bodies are connected with each other to form the plurality of openings.

3. The transfer chamber of claim 1, wherein the plurality of closers close the plurality of openings except for:

a first connection opening serving as a passage for connecting the buffer unit to the transfer chamber; and second connection openings serving as passages for connecting the process chambers to the transfer chamber.

4. The transfer chamber of claim 3, further comprising a buffer door mounted to be vertically movable on a side surface connected to the buffer unit to open or close the first connection opening.

5. The transfer chamber of claim 4, further comprising:

a gas sensor for sensing a gas leaking from an inside of the transfer chamber through the first connection opening.

6. The transfer chamber of claim 3, wherein the second connection openings are provided to face shutters for opening or closing wafer paths of the process chambers.

7. The transfer chamber of claim 1, wherein each closer of the plurality of closers comprises:

a supporter mounted along an edge of a corresponding opening of the plurality of openings formed by the frame; and a cover connected to the supporter.

8. The transfer chamber of claim 7, wherein an O-ring is interposed between the supporter and the cover.

9. The transfer chamber of claim 1, wherein the plurality of closers are bonded to the frame by interposing a molding adhesive therebetween.

10. The transfer chamber of claim 9, wherein a powder coat is further formed on bonded portions between the frame and the plurality of closers.

11. The transfer chamber of claim 1, wherein the exhaust pipes are provided under the transfer chamber.

12. The transfer chamber of claim 11, wherein exhaust holes connected to the exhaust pipes are provided in a closer disposed on a bottom surface of the transfer chamber.

13. A wafer processing module comprising:

a buffer unit;

a transfer chamber coupled to the buffer unit; and process chambers coupled to the transfer chamber, wherein the buffer unit provides a space where wafers stay before being transferred from an outside of the transfer chamber into the transfer chamber or from the transfer chamber to the outside of the transfer chamber, wherein the transfer chamber is disposed between the buffer unit and the process chambers to transfer the wafers between the buffer unit and the process chambers, or between the process chambers, wherein in the process chambers, the wafers are processed, wherein the transfer chamber comprises:

a main robot for transferring the wafers between the buffer unit and the process chambers, or between the process chambers;

a guide rail connected to the main robot to move the main robot;

a frame defining an inner space where the main robot and the guide rail of the transfer chamber operate and provided with a plurality of openings connected to the inner space;

a plurality of closers connected to the frame and covering the plurality of openings such that the plurality of closers close the plurality of openings of the frame; and airflow suppliers mounted on the transfer chamber to form downward airflows in the inner space of the transfer chamber and expel the downward airflows through exhaust pipes to an outside.

14. The wafer processing module of claim 13, wherein the frame comprises:

a plurality of first frame bodies extending in a first direction;

a plurality of second frame bodies extending in a second direction perpendicular to the first direction; and a plurality of third frame bodies extending in a third direction perpendicular to a horizontal plane formed by the first and second directions, and wherein the plurality of first frame bodies, the plurality of second frame bodies, and the plurality of third frame bodies are connected with each other to form the plurality of openings.

15. The wafer processing module of claim 13, wherein the plurality of closers close the plurality of openings except for:

a first connection opening serving as a passage for connecting the buffer unit to the transfer chamber; and second connection openings serving as passages for connecting the process chambers to the transfer chamber.

16. The wafer processing module of claim 15, further comprising:

a buffer door mounted to be vertically movable on a side surface connected to the buffer unit to open or close the first connection opening.

17. The wafer processing module of claim 15, wherein the second connection openings are provided to face shutters for opening or closing wafer paths of the process chambers.

18. The wafer processing module of claim 13, wherein the exhaust pipes are provided under the transfer chamber.

19. A wafer processing module comprising:

a buffer unit;

a transfer chamber;

process chambers, wherein the buffer unit provides a space where wafers stay before being transferred from an outside of the transfer chamber into the transfer chamber or from the transfer chamber to the outside of the transfer chamber, wherein the transfer chamber is disposed between the buffer unit and the process chambers to transfer the wafers between the buffer unit and the process chambers, or between the process chambers, wherein in the process chambers, the wafers are processed, and wherein the transfer chamber comprises:

a main robot for transferring the wafers between the buffer unit and the process chambers, or between the process chambers;

a guide rail connected to the main robot to move the main robot;

a frame defining an inner space where the main robot and the guide rail of the transfer chamber operate and provided with a plurality of openings connected to the inner space;

a plurality of closers connected to the frame and covering the plurality of openings such that the plurality of closers close the plurality of openings of the frame, except for a first connection opening serving as a passage for connecting the buffer unit to the transfer chamber, and second connection openings serving as passages for connecting the process chambers to the transfer chamber;

a buffer door mounted to be vertically movable on a side surface connected to the buffer unit to open or close the first connection opening, wherein the second connection openings are provided to face shutters for opening or closing wafer paths of the process chambers, and wherein, in an emergency situation, the buffer door closes the first connection opening, the shutters close the second connection openings, and the plurality of closers close the plurality of openings, thereby preventing leakage of a gas to the outside of the transfer chamber; and airflow suppliers mounted on the transfer chamber to form downward airflows in the inner space of the transfer chamber and expel the downward airflows through exhaust pipes to an outside.

* * * * *